United States Patent [19]

Fukusho

[11] Patent Number: 5,523,609
[45] Date of Patent: Jun. 4, 1996

[54] SOLID-STATE IMAGE SENSING DEVICE HAVING A VERTICAL TRANSFER LINE AND A CHARGE TRANSFER REGION WITH BUFFER LAYER CONTAINING HYDROGEN BETWEEN LIGHT SHIELDING LAYER AND INSULATING LAYER

[75] Inventor: Takashi Fukusho, Kanagawa, Japan

[73] Assignee: Sony Corporation, Tokyo, Japan

[21] Appl. No.: 362,920

[22] Filed: Dec. 23, 1994

[30] Foreign Application Priority Data

Dec. 27, 1993 [JP] Japan .................................. 5-351599

[51] Int. Cl.$^6$ .................................................. H01L 31/0232
[52] U.S. Cl. ............................ 257/435; 257/436; 257/437
[58] Field of Search .................................. 257/222, 232, 257/233, 234, 432, 435, 436, 437, 443

[56] References Cited

FOREIGN PATENT DOCUMENTS 502521   9/1992   European Pat. Off. ............... 257/435
1-19760  1/1989   Japan ..................................... 257/437
3-227063 10/1991  Japan ..................................... 257/435

Primary Examiner—Rolf Hille
Assistant Examiner—Minhloan Tran
Attorney, Agent, or Firm—Hill, Steadman & Simpson

[57] ABSTRACT

A solid-state image sensing device, such as a charge-coupled image sensor, has a plurality of sensor regions arranged in two-dimensions with vertical transfer lines associated with respective vertical rows of the sensor regions for transfer of signal charges read from the sensor regions. Each vertical transfer line comprises a charge transfer region for transferring the signal charges read from the sensor regions. A gate electrode is formed on an insulating layer over the signal charge transfer regions, a light shielding layer is formed on an interlayer insulating layer over the gate electrode, and a buffer film containing hydrogen underlies the light shielding layer. The buffer layer, such as a buffer layer containing hydrogen, prevents damage attributable to film forming processes and the diffusion of impurities from the light shielding layer, and supplies hydrogen into the interface between the substrate and an oxide film to improve the condition of the interface. Thus, dark current can be reduced.

9 Claims, 4 Drawing Sheets

SOLID-STATE IMAGE SENSING DEVICE HAVING A VERTICAL TRANSFER LINE AND A CHARGE TRANSFER REGION WITH BUFFER LAYER CONTAINING HYDROGEN BETWEEN LIGHT SHIELDING LAYER AND INSULATING LAYER

BACKGROUND OF THE INVENTION

1. Field of the Invention

The present invention relates to a solid-state image sensing device, a method of fabricating the same, and a semiconductor device and, more particularly, to the construction of vertical charge transfer regions for transferring signal charges, associated with respective vertical rows of a plurality of sensor regions arranged in two-dimensions, a method of fabricating the vertical charge transfer regions, and a semiconductor device comprising a layer of a hydrogen storage alloy.

2. Description of Related Art

In a solid-state image sensing device, such as a charge-coupled image sensor (CCD), a plurality of sensor regions are arranged in two-dimensions, and vertical transfer lines for vertically transferring signal charges provided by the sensor regions are connected to respective vertical rows of the sensor regions. As shown in FIG. 6, in the vertical transfer line, a gate electrode 64 is formed near sensor regions 62 on a silicon dioxide film 63 formed on a silicon substrate 61, a polycrystalline oxide film 65 is formed over the gate electrode 64, a interlayer insulating layer 66 such as a PSG (phosphate glass film) is deposited over the polycrystalline oxide film 65 by an atmospheric pressure CVD process, and a light shielding layer 67 of a metal film of aluminum or the like is formed over the surface the interlayer insulating layer 66, excluding areas corresponding to the sensor regions 62, to shield a signal charge transfer layer 68 from external light.

When forming the light shielding layer 67 of a metal film after forming the interlayer insulating layer 66 by an atmospheric pressure CVD process in fabricating the charge-coupled image sensor of the aforesaid construction, damage attributable to sputtering or plasma is caused, and impurities diffuse through the interlayer insulating layer 66 into the interface between the silicon substrate 61 and the silicon dioxide film 63 and into the silicon substrate 61 during film forming processes and film processing processes to increase defects in the charge-coupled image sensor.

If the interlayer insulating layer 66 is formed with a comparatively large thickness to obviate such a problem, the quantity of light reflected by the surface of the silicon substrate 61 and falling on the lower surface of the light shielding layer 67 increases when light falls obliquely on the sensor regions 62. Consequently, the reflected light repeats with a multiple reflection between the surface of the silicon substrate 61 and the lower surface of the light shielding layer 67 and between the surface of the silicon substrate 61 and the gate electrode 64, and finally impinges on the signal charge transfer layer 68 to make the signal charge transfer layer 68 emit photoelectrons, which add to smear.

SUMMARY OF THE INVENTION

The present invention has been made in view of those problems and it is therefore an object of the present invention to provide a solid-state image sensing device capable of suppressing smear and of reducing defects in images, and a method of fabricating such a solid-state image sensing device.

Another object of the present invention is to provide a solid-state image sensing device capable of reducing dark current of an intensity dependent on the condition of the interface between a silicon substrate and an oxide film, a method of fabricating such a solid-state image sensing device, and a semiconductor device.

In accordance with the present invention, a solid-state image sensing device comprises a plurality of sensor regions, and a plurality of vertical transfer lines provided for the respective vertical rows of the sensor regions. Each of the vertical transfer lines comprises a charge transfer region for transferring signal charges read from the sensor regions, a gate electrode formed above the charge transfer region through an insulating layer, a light shielding layer formed over the gate electrode through an interlayer insulating layer, and a buffer layer formed under the light shielding layer. The buffer layer contains hydrogen.

In accordance with the present invention, there is provided a process of manufacturing a solid-state image sensing device comprising forming a gate electrode on an insulating layer formed over a signal charge transfer region formed on the side of the surface of a substrate, forming an interlayer insulating layer over the gate electrode and sensor regions, forming a buffer layer over the interlayer insulating layer, and forming a light shielding layer over the surface of the buffer layer excluding an area of the surface corresponding to the sensor regions.

According to another aspect of the present invention, there is provided a method comprising forming a gate electrode over an insulating layer formed over a signal charge transfer region formed on the side of the surface of a substrate, forming an interlayer insulating layer over the gate electrode and sensor regions, forming a buffer layer over the interlayer insulating layer, removing portions of the silicon nitride film corresponding to the sensor regions by etching, forming a light shielding layer only on the silicon nitride film, and then forming a passivation layer over the entire surface. In a preferred embodiment, the buffer layer comprises a silicon nitride film or a silicon oxynitride film. The silicon nitride film may be formed by plasma CVD.

A semiconductor device in accordance with the present invention comprises a hydrogen storage alloy layer of a hydrogen storage alloy, and a buffer layer underlying the hydrogen storage alloy layer.

In the solid-state image sensing device, such as a charge-coupled image sensor, the buffer layer underlying the light shielding layer shielding time vertical transfer line serves as a buffer layer for preventing the diffusion of impurities from the light shielding layer, and damage that will be caused by film forming processes. Since the buffer layer prevents the diffusion of impurities from the light shielding layer and damage attributable to the film forming processes, the interlayer insulating layer may be formed in a comparatively small thickness, and hence the leakage of the reflected light reflected by the surface of the silicon substrate into the vertical transfer line can be suppressed, so that smear can be reduced.

Since the buffer layer underlying the light shielding layer has an agent to supply hydrogen to the interface between the silicon substrate and the silicon dioxide film, the condition of the interface can be improved, which promotes the reduction of dark current.

Since the method of fabricating a solid-state image sensing device, such as a charge-coupled image sensor, forms the buffer layer over the interlayer insulating layer formed over the gate electrode and sensor regions, and forms the light shielding layer over the surface of the buffer layer excluding areas corresponding to the sensor regions, the sensor regions are covered with the buffer layer. The buffer layer serves as a protective film for protecting the sensor regions from contamination in the following processes.

Since another method of fabricating a solid-state interlayer insulating layer formed over the gate electrode and the sensing regions, etches portions of the buffer layer corresponding to the sensor regions and forms the light shielding layer only over the buffer layer, the sensor regions are not covered with the buffer layer and the buffer layer extends only under the light shielding layer. Therefore, sensor regions are covered only with the final protective film, and the spectral characteristics of the sensor regions can be adjusted to desired values by optionally determining the thickness of the protective film.

In a solid-state image sensor including a solid-state image sensing device, dark current can be reduced by holding down the energy level of the interface between the silicon substrate and the silicon dioxide film by hydrogen. Accordingly, when a buffer layer or the like is formed beneath a hydrogen storage alloy layer of titanium, titanium nitride, titanium oxide, titanium oxynitride or the like, the buffer layer supplies hydrogen into the interface between the silicon substrate and the silicon oxide film, whereby the condition of the interface can be improved to reduce dark current.

BRIEF DESCRIPTION OF THE DRAWINGS

The above and other objects, features and advantages of the present invention will become more apparent from the following description taken in conjunction with the accompanying drawings, in which.

DETAILED DESCRIPTION OF THE PREFERRED EMBODIMENTS

Figure 1:
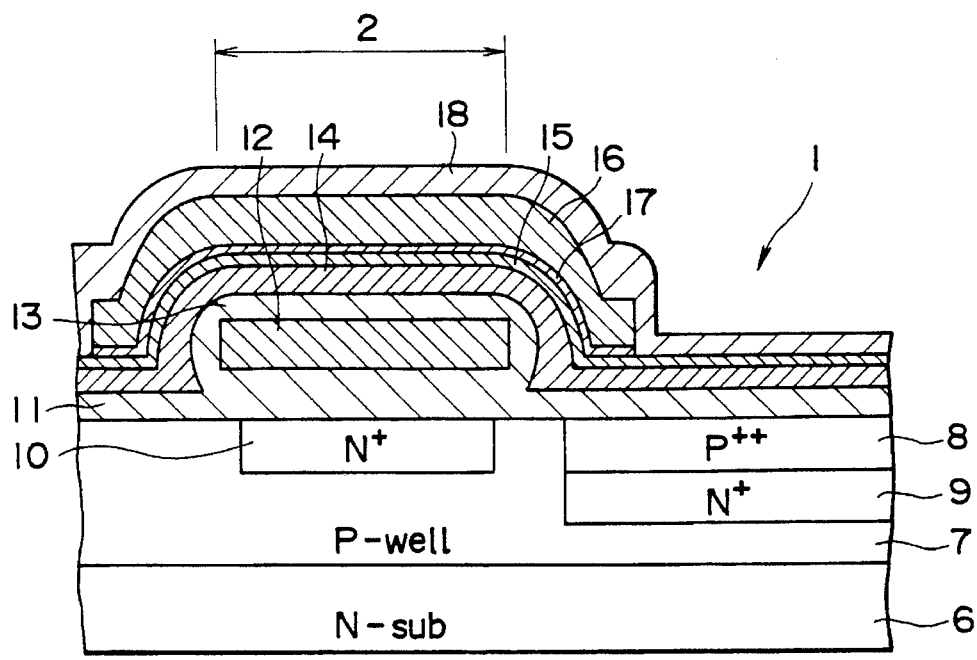
FIG. 1 is a schematic sectional view of an essential portion of a charge-coupled image sensor in a first embodiment according to the present invention, taken on line A–A' in FIG. 2.
Figure 2:
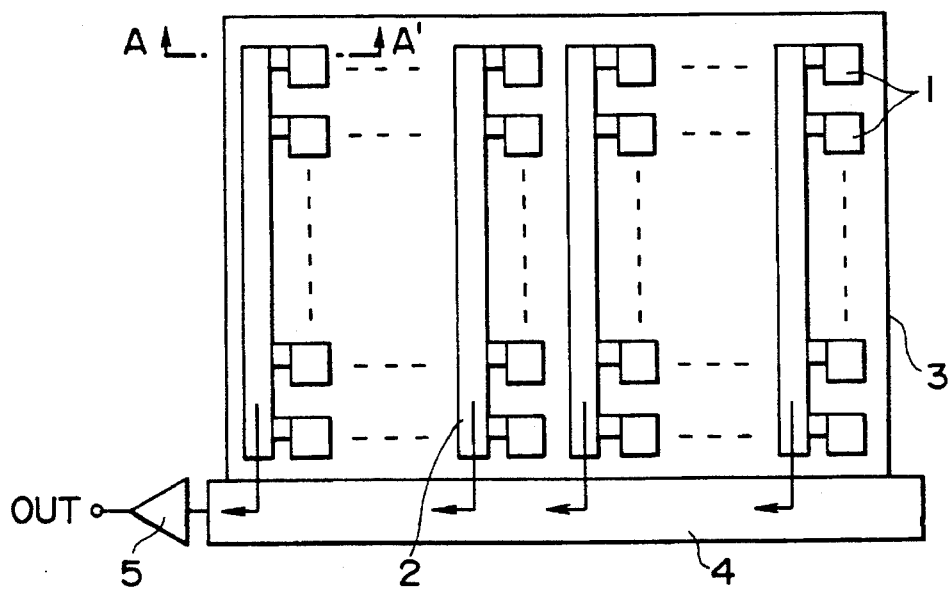
FIG. 2 is a schematic plan view of the charge-coupled image sensor embodying the present invention.

FIGS. 1 and 2 are a schematic sectional view and a schematic plan view, respectively, of an essential portion of a charge-coupled image sensor in a first embodiment according to the present invention.

Referring to FIG. 2, the charge-coupled image sensor has a light sensing unit 3 comprising sensor regions 1 (pixels) for storing electric charges obtained by the photoelectric conversion of incident light, arranged in two-dimensions along horizontal lines and vertical lines, and a plurality of vertical transfer lines 2 (CCD shift registers) connected respectively to the vertical rows of the sensor regions 1 to vertically transfer signal charges stored in the sensor regions 1. Signal charges produced through photoelectric conversion by the sensor regions 1 are read by the vertical transfer line 2 in part of a vertical blanking interval. Part of the signal charges read by the vertical transfer lines 2 corresponding to one scanning line is transferred to a horizontal transfer region 4 (CCD shift register) in part of a horizontal blanking interval. The signal charges for one scanning line are transferred sequentially in a horizontal direction by the horizontal transfer region 4. A charge detector 5, such as a floating diffusion amplifier, is connected to one end of the horizontal transfer region 4. The charge detector 5 detects signal charges transferred by the horizontal transfer region 4 and converts the same into corresponding signal voltages.

FIG. 1 is a sectional view taken on lane A–A' in FIG. 2. Referring to FIG. 1, the sensor region 1 is a HAD (hole accumulation diode) structure comprising a hole accumulating layer 8, namely p++-type doped layer formed in a p-type well formed in a n-type silicon substrate 6, and a signal charge accumulating layer 9, namely an n+-type doped layer underlying the p++-type doped layer. The vertical transfer line 2 comprises a signal charge transfer region 10, namely an n+-type doped layer formed in the surface of the silicon substrate 6, and a gate electrode 12 of polycrystalline silicon formed on a silicon dioxide film (or a buffer layer) 11 formed on the silicon substrate 6. The sensor region 1 and the gate electrode 12 are coated with the silicon dioxide film 11, a polycrystalline oxide film, and a interlayer insulating layer 14, such as a PSG film, formed by an atmospheric pressure CVD process formed in that order. A buffer film 15, i.e. a buffer layer, is deposited by, for example, a plasma CVD process over the interlayer insulating layer 14. The buffer film 15 need not necessarily be a buffer layer formed by a plasma CVD process; the same may be a buffer layer or a silicon oxynitride film formed by an ECR plasma CVD process.

A light shielding layer 16 of a metal, such as aluminum, an aluminum alloy, tungsten, molybdenum or such, is formed over the surface of the buffer film 15, excluding areas corresponding to the sensor regions 1. A low-reflectance film (layer) 17 of a titanium alloy, such as a titanium oxynitride, a titanium oxide or a titanium nitride, underlies the light shielding layer 16. The outer surface including the surface of the light shielding layer 16 and the surface of the buffer film 15 covering the sensor regions 1 is covered with a passivation film 18, i.e. a protective film.

Since the low-reflectance film 17 underlies the light shielding layer 16 as mentioned above, light obliquely falling on the sensor region 1 and reflected by the surface of the silicon substrate 6 toward the light shielding layer 16 is absorbed by the low-reflectance film 17. Therefore, the multiple reflection of the light reflected by the surface of the silicon substrate 6 between the surface of the silicon substrate 6 and the lower surface of the light shielding layer 16 and between the surface of the silicon substrate 6 and the gate electrode 12 will not occur, the reflected light will not impinge on the signal charge transfer region 10 to generate photoelectrons and, consequently, creating a false signal, can be reduced.

Although the low-reflectance film of a titanium alloy must underlie the light shielding layer 16 to use the low-reflectance film for absorbing the reflected light, the low-reflectance film need not underlie the light shielding layer 16 when the same is used for other purposes; that is, the titanium alloy film may be the intermediate layer or the uppermost layer of the light shielding layer 16. In the latter case, the buffer film 15 having an appropriate reflectance and underlying the light shielding layer 16 can be used as a low-reflectance film to reduce smear. The buffer film 15 underlying the light shielding layer 16 including the low-reflectance film 17 prevents sputtering damage, plasma damage and the diffusion of impurities from the light shielding layer 16 when forming the light shielding layer 16 after depositing the interlayer insulating layer 14. Since damage attributable to film forming processes and the diffusion of impurities from the light shielding layer 16 through the interlayer insulating layer 14 into the interface between the silicon substrate 6 and the oxide film 11 and into the silicon substrate 6 can be thus prevented, image defects in the charge-coupled image sensor can be reduced. Since damage and the diffusion of impurities from the light shielding layer 16 can be prevented by the buffer film 15, the interlayer insulating layer 14 may be formed in a comparatively small thickness. Therefore, the leakage of reflected light reflected by the surface of the silicon substrate 6 into the vertical transfer line 2 can be suppressed and, consequently smear attributable to false signals provided by the charge-coupled image sensor can be further reduced.

Incidentally, as is generally known, dark current can be reduced by holding down the energy level of the interface between the silicon substrate 6 and the silicon oxide film 11 with hydrogen. Since the buffer film 15, i.e. a buffer layer containing hydrogen, underlying the light shielding layer 16 supplies hydrogen into the interface between the silicon substrate 6 and the silicon oxide film 11 to improve the condition of the interface, this promotes the reduction of dark current.

When the semiconductor device of the invention has a hydrogen storage alloy layer of the hydrogen storage alloy underlying the buffer layer, as previously mentioned, this hydrogen storage alloy can be provided by forming the low-reflectance film as a layer 17 as a hydrogen storage alloy, or the light shielding layer 16 can comprise a hydrogen storage alloy.

Figure 3:
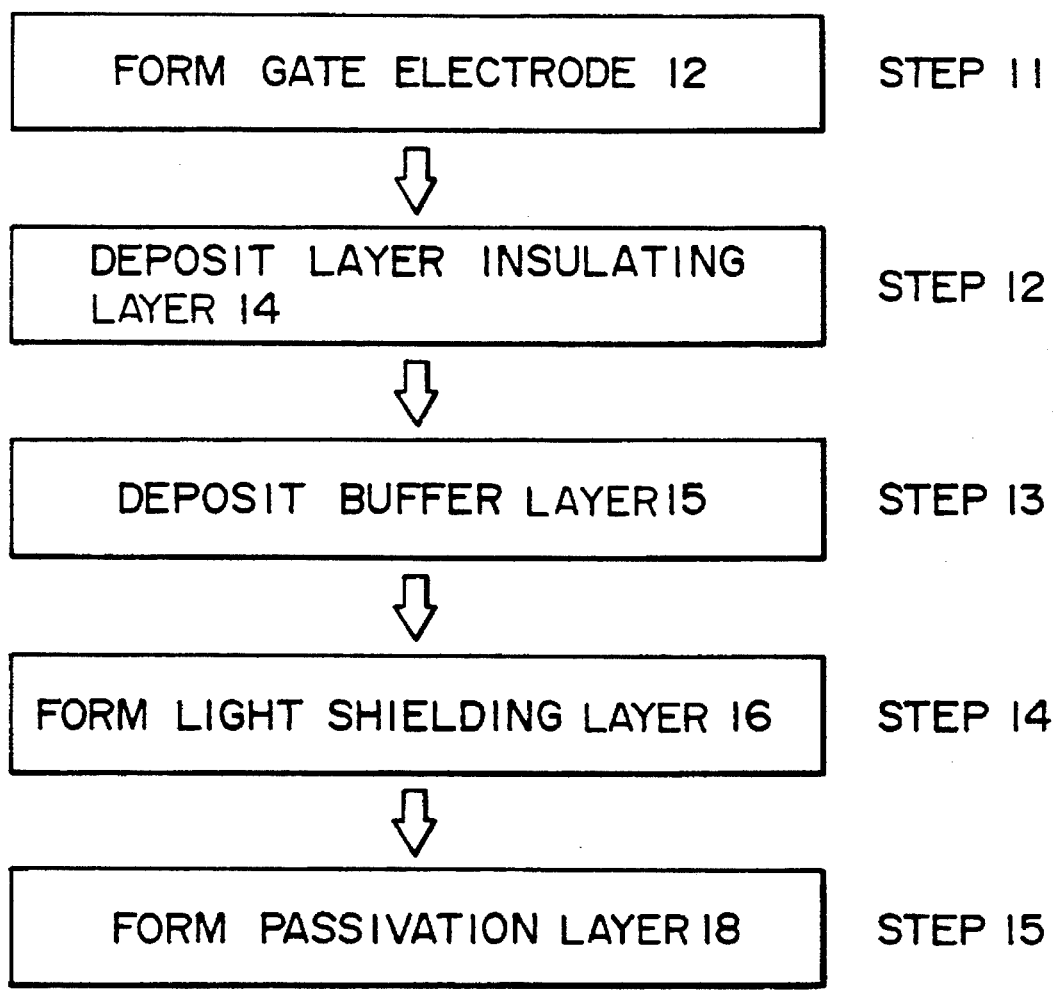
FIG. 3 is a flow chart of a method of fabricating a charge-coupled image sensor, in accordance with the present invention.

A procedure for fabricating the charge-coupled image sensor will be described hereinafter with reference to FIG. 3. The procedure includes steps to be executed after the silicon substrate 6 has been doped, and the sensor regions 1 and the signal charge transfer region 10 of the vertical transfer line 2 have been formed.

In step 11, the gate electrode 12 of polycrystalline silicon is formed on the silicon dioxide film 11 covering the signal charge transfer region 10. In step 12, the interlayer insulating layer 14 is formed by an atmospheric pressure CVD process over the sensor regions 1 and the gate electrode 12 so as to overlie the silicon dioxide film 11 and the polycrystalline oxide film 13. In step 13, the buffer film 15 of silicon nitride containing hydrogen is deposited by a plasma CVD process on the interlayer insulating layer 14. In step 14, the light shielding layer 16 is formed over the surface of the low-reflectance film 17, excluding areas corresponding to the sensor regions 1. In step 15, the passivation film 18, i.e., a protective film, is formed over the entire outer surface of the workpiece. As is obvious from FIG. 1, in the charge-coupled image sensor fabricated by the foregoing procedure, the sensor regions 1 are covered with the a buffer film 15 of buffer layer, and the buffer film 15 serves as a protective film for protecting the sensor regions from contamination in the following processes.

Figure 4:
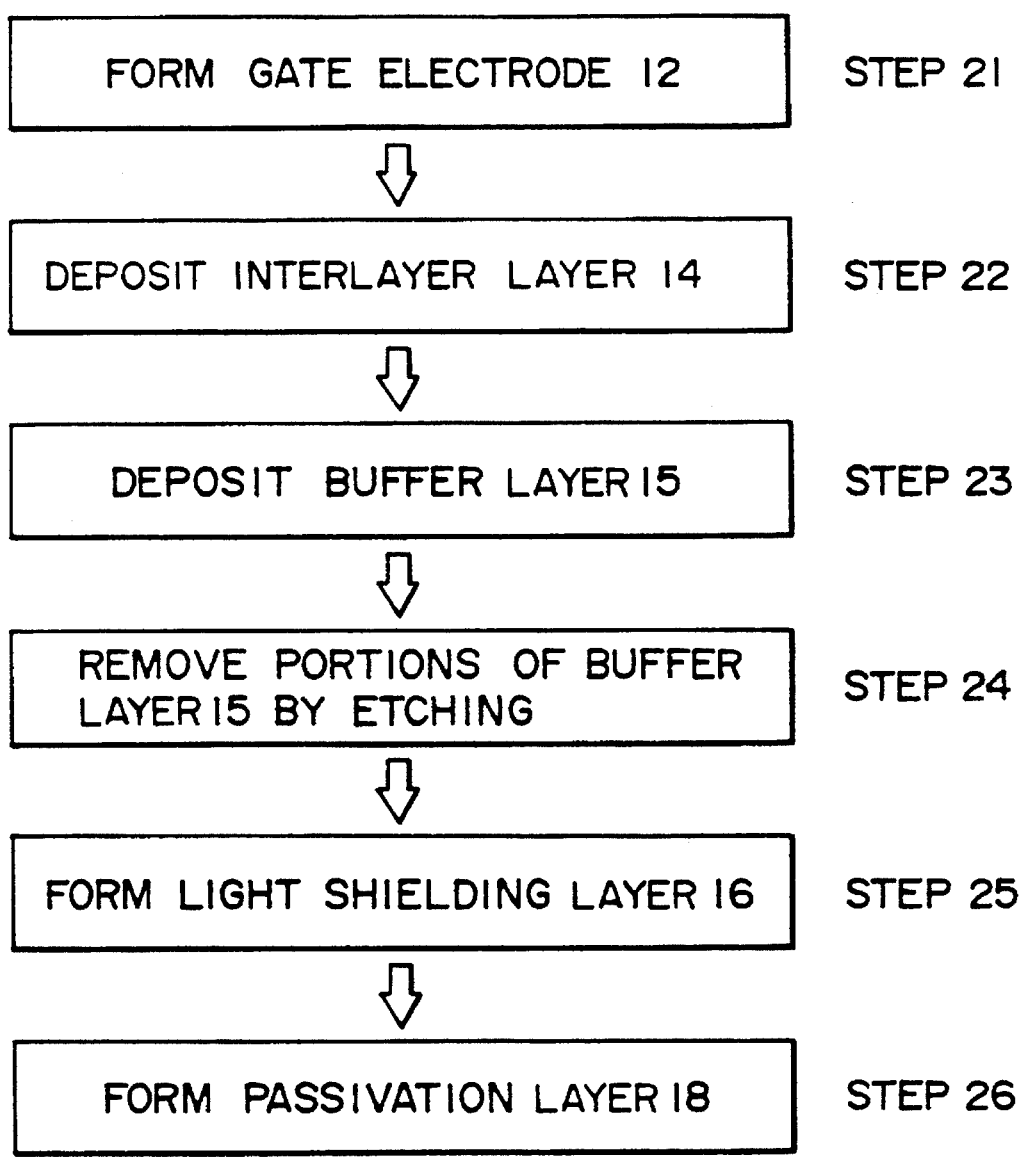
FIG. 4 is a flow chart of another method of fabricating a charge-coupled image sensor, in accordance with the present invention.

Another procedure for fabricating the charge-coupled image sensor, in accordance with the present invention, will be described with reference to FIG. 4. The procedure includes steps to be executed after the silicon substrate 6 has been doped, and the sensor regions 1 and the signal charge transfer region 10 have been formed.

In step 21, the gate electrode 12 of polycrystalline silicon is formed on the silicon dioxide film 11 covering the signal charge transfer region 10. In step 22, the interlayer insulating layer 14 is formed by an atmospheric pressure CVD process on the layer of the silicon dioxide film 11 and the polycrystalline oxide film 13 over the sensor regions 1 and the gate electrode 12. In step 23, the buffer film 15 of silicon nitride is formed by a plasma CVD process over the interlayer insulating layer 14. In step 24, portions of the buffer film 15 corresponding to the sensor regions 1 are removed by etching. In step 25, the low-reflectance film 17 and the light shielding layer 16 of a metal are formed on the remaining portions of the buffer film 15. It is also possible to form the buffer film 15, the low-reflectance film 17 and the light shielding layer 16 in that order over the sensor regions 1 and to remove portions of the buffer film 15, the low-reflectance film 17 and the light shielding layer 16 corresponding to the sensor regions i simultaneously by etching. In the final step 26, the entire outer surface of the Workpiece is covered with the passivation film 18, i.e. a protective film.

Figure 5:
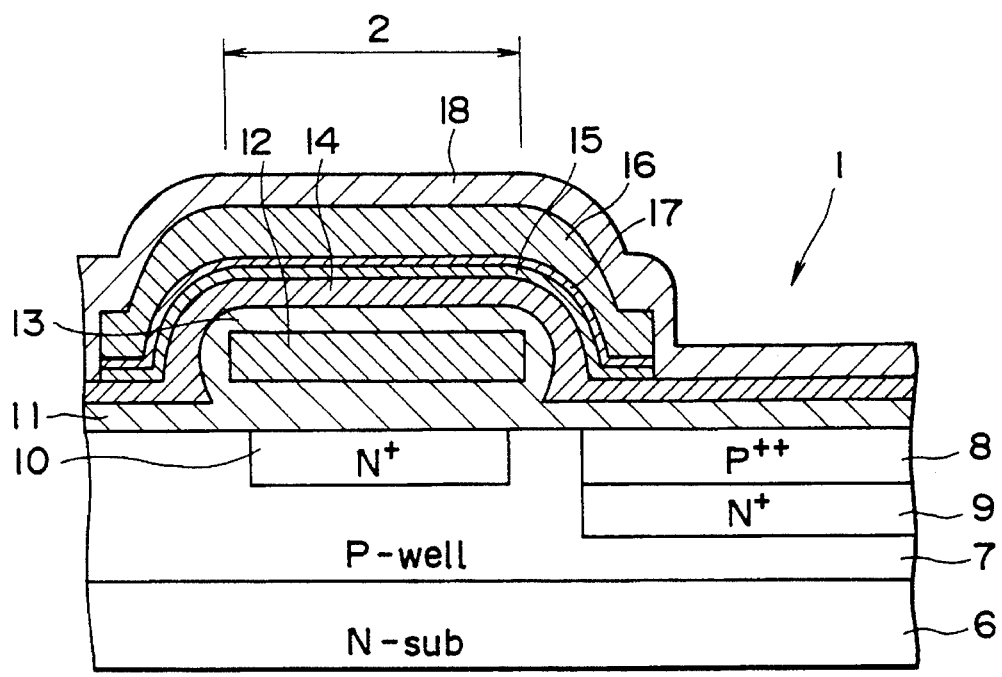
FIG. 5 is a schematic sectional view of an essential portion of a charge-coupled image sensor in a second embodiment according to the present invention.
Figure 6:
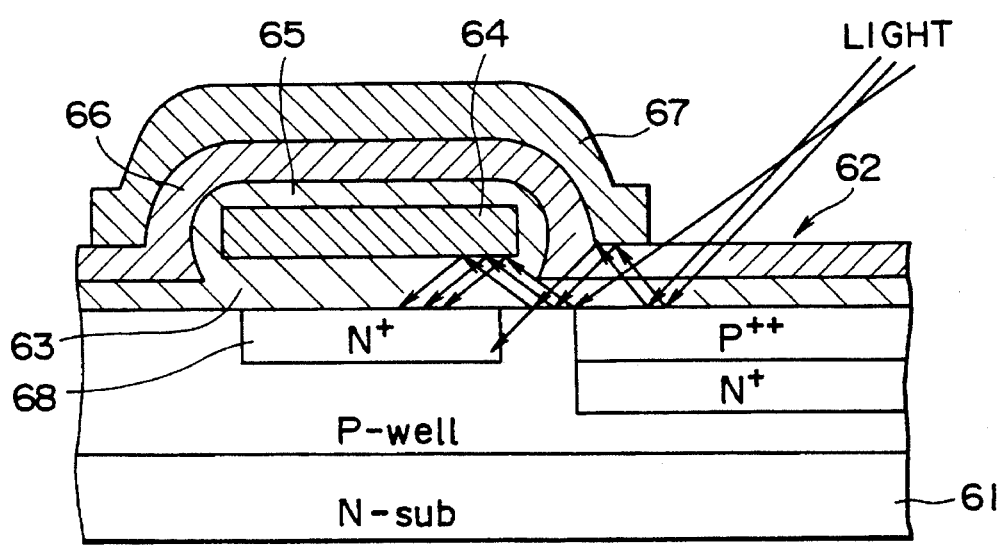
FIG. 6 is a schematic sectional view of an essential portion of a conventional charge-coupled image sensor.

The charge-coupled image sensor thus fabricated by the procedure shown in FIG. 5 has the sensor regions 1 not covered with the buffer film 15 and the sensor regions 1 are covered only with the passivation film 18 as shown in FIG. 5. Therefore, the spectral characteristics of the sensor regions 1 can be adjusted to desired spectral characteristics by optionally determining the thickness of the passivation film 18. Since the charge-coupled image sensor of FIG. 5, similarly to the charge-coupled image sensor of FIG. 1, is provided with the buffer film 15 of silicon nitrite beneath the light shielding layer 16 including the low-reflectance film 17, the diffusion of impurities from the light shielding layer 16 and damage attributable to film forming processes can be prevented, and hydrogen can be supplied from the buffer layer into the interface between the silicon substrate 6 and the silicon dioxide film 11 and into the silicon substrate 6 to improve the condition of the interface. Consequently, image defects in the charge-coupled image sensor can be reduced, and the interlayer insulating layer 14 can be made thin in thickness to reduce smear. The improvement of the condition of the interface between the silicon substrate 6 and the silicon dioxide film 11 promotes the reduction of dark current.

Although the present invention has been described as applied to the construction of the vertical transfer lines 2 of the foregoing preferred embodiments of the present invention, the present invention is not limited thereto in its practical application and is applicable to various semiconductor devices including DRAMs provided with a layer of a hydrogen storage alloy, such as a titanium alloy or the like. For example, in a semiconductor device provided with a wiring layer of a hydrogen storage alloy and a buffer layer containing hydrogen and formed beneath the wiring layer, hydrogen can be supplied from the buffer layer into the interface between the silicon substrate and the silicon dioxide film to improve the condition of the interface even if hydrogen supplied from an external hydrogen source is absorbed by the wiring layer, whereby the reduction of dark current, the generation of which is dependent on the condition of the interface, can be promoted.

Although the invention has been described in its preferred forms with a certain degree of particularity, obviously many changes and variations may be made therein. It is therefore to be understood that the present invention may be practiced otherwise than as specifically described herein without departing from the scope and spirit thereof.

What is claimed is:

1. A solid-state image sensing device, comprising:

a plurality of sensor regions arranged in a matrix, each sensor region generating a signal charge of an amount corresponding to an intensity of incident light; and a plurality of vertical transfer lines provided for vertical rows of the sensor regions, each vertical transfer line comprising a charge transfer region for transferring signal charge read from the sensor regions, a gate electrode formed above the charge transfer region in an insulating layer lying on the charge transfer region, a light shielding layer formed above the gate electrode and above an interlayer insulating layer, and a buffer layer containing hydrogen between the light shielding layer and the interlayer insulating layer.

2. A solid-state image sensing device according to claim 1 wherein the buffer layer is a silicon oxynitride film.

3. A solid-state image sensing device according to claim 2 wherein the silicon oxynitride film is a plasma-deposited silicon oxynitride film.

4. A solid-state image sensing device according to claim 1 wherein a low-reflectance film is sandwiched between the light shielding layer and the buffer layer.

5. A solid-state image sensing device according to claim 4 wherein the low-reflectance film is formed of a hydrogen storage alloy.

6. A solid-state image sensing device according to claim 1 wherein the light shielding layer comprises a hydrogen storage alloy.

7. A solid-state image sensing device according to claim 6 wherein the hydrogen storage alloy is a titanium alloy.

8. A solid-state image sensing device according to claim 1 wherein the buffer layer extends over the sensor regions.

9. A solid-state image sensing device, comprising:

a plurality of sensor regions arranged in a matrix, each sensor region generating a signal charge of an amount corresponding to an intensity of incident light;

a plurality of vertical transfer lines provided for vertical rows of the sensor regions; and each vertical transfer line comprising a charge transfer region in the substrate for transferring signal charge read from the sensor regions, an insulating layer overlying the charge transfer region, a gate electrode within the insulating layer, an interlayer insulating layer on the insulating layer, a buffer film on the interlayer insulating layer containing hydrogen, a low reflectance film layer on the buffer layer, and a light shielding layer on the low reflectance film layer.

* * * * *